United States Patent
Hu et al.

(10) Patent No.: US 11,187,939 B2
(45) Date of Patent: Nov. 30, 2021

(54) LIGHT SOURCE, LIGHT SOURCE ASSEMBLY, DISPLAY DEVICE AND DISPLAY METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Weipin Hu, Beijing (CN); Chun Wang, Beijing (CN); Mingxiao Jiang, Beijing (CN); Congcong Wei, Beijing (CN); Xiao Sun, Beijing (CN); Xiang Feng, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 633 days.

(21) Appl. No.: 16/081,973

(22) PCT Filed: Jan. 8, 2018

(86) PCT No.: PCT/CN2018/071733
§ 371 (c)(1),
(2) Date: Sep. 4, 2018

(87) PCT Pub. No.: WO2018/192278
PCT Pub. Date: Oct. 25, 2018

(65) Prior Publication Data
US 2021/0208454 A1 Jul. 8, 2021

(30) Foreign Application Priority Data
Apr. 20, 2017 (CN) .......................... 201710262735.5

(51) Int. Cl.
G02F 1/13357 (2006.01)
H04N 13/32 (2018.01)
H01L 27/32 (2006.01)

(52) U.S. Cl.
CPC .. G02F 1/133603 (2013.01); G02F 1/133605 (2013.01); H01L 27/3232 (2013.01); H04N 13/32 (2018.05)

(58) Field of Classification Search
None
See application file for complete search history.

(56) References Cited

U.S. PATENT DOCUMENTS

| 5,831,765 A | 11/1998 | Nakayama et al. |
| 2003/0016205 A1* | 1/2003 | Kawabata .............. G09G 3/342 345/102 |

(Continued)

FOREIGN PATENT DOCUMENTS

| CN | 101241252 A | 8/2008 |
| CN | 102809088 A | 12/2012 |

(Continued)

OTHER PUBLICATIONS

Search Report and Written Opinion for International Application No. PCT/CN2018/071733 dated Apr. 12, 2018.

(Continued)

*Primary Examiner* — Vip Patel
(74) *Attorney, Agent, or Firm* — Calfee, Halter & Griswold LLP (57) ABSTRACT

A light source, a light source assembly, a display device and a display method. The light source comprises a first light emitting region and a second light emitting region. The first light emitting region and the second light emitting region can control ON or OFF of the light emission separately. The first light emitting region and the second light emitting (Continued)

region are arranged alternately along a first direction. The first light emitting region and the second light emitting region of the light sources in this disclosure can be controlled separately. Hence, one light emitting region can be made to emit light while the other light emitting region can be made to be turned off. There is no stray light in the turned-off light emitting region, so as to avoid stray light crosstalk to light of the other light emitting region.

16 Claims, 3 Drawing Sheets

(56) References Cited

U.S. PATENT DOCUMENTS

2005/0157223 A1* 7/2005 Sung .................... H04N 13/312
349/69

2008/0192156 A1 8/2008 Hamagishi et al.
2012/0307181 A1 12/2012 Fang
2018/0239192 A1 8/2018 Zhang

FOREIGN PATENT DOCUMENTS

| CN | 105842925 A | 8/2016 |
| CN | 105929597 A | 9/2016 |
| CN | 107024802 A | 8/2017 |
| JP | 09102969 A | 4/1997 |

OTHER PUBLICATIONS

First Office Action for Chinese Patent Application No. 201710262735.5 dated May 3, 2018.
Second Office Action for Chinese Patent Application No. 201710262735.5 dated Nov. 23, 2018.

* cited by examiner

LIGHT SOURCE, LIGHT SOURCE ASSEMBLY, DISPLAY DEVICE AND DISPLAY METHOD

RELATED APPLICATION

The present application is the U.S. national phase entry of PCT/CN2018/071733, with an international filing date of Jan. 8, 2018, which claims benefit of priority to Chinese patent application No. 201710262735.5 filed on Apr. 20, 2017, the entire content of which is incorporated herein by reference.

TECHNICAL FIELD

This disclosure relates to the field of TFT-LCD technology, particularly to a light source, a light source assembly, a display device and a display method.

BACKGROUND

With the continuous development of the display industry, the requirements for display quality and display effects of TFT (thin film transistor)-LCD (liquid crystal display) are increasing.

SUMMARY

This disclosure provides a light source, a light source assembly, a display device and a display method, so as to solve the problem that the existing LGP emits light as a whole and cannot be controlled region by region.

In order to solve the above problem, this disclosure discloses a light source. The light source comprises a first light emitting region and a second light emitting region. The first light emitting region and the second light emitting region are capable of control ON or OFF of the light emission separately. The first light emitting region and the second light emitting region are arranged alternately along a first direction.

In certain exemplary embodiments, light emitting areas of the first light emitting region and the second light emitting region are equal.

In certain exemplary embodiments, a shape of the first light emitting region and a shape of the second light emitting region are both strip shapes. A length direction of the first light emitting region and a length direction of the second light emitting region are perpendicular to the first direction.

In certain exemplary embodiments, the first light emitting region and the second light emitting region are both constituted by a plurality of white organic light emitting diodes (WOLED).

In order to solve the above problem, this disclosure further discloses a light source assembly. The light source assembly comprises a stacked light transmission component and the light source as stated above.

The light transmission component comprises a first adjustable light transmission region and a second adjustable light transmission region. The first adjustable light transmission region and the second adjustable light transmission region are capable of controlling transmission or occlusion of light separately. An orthographic projection of the first light emitting region on the light transmission component coincides with the first adjustable light transmission region, and an orthographic projection of the second light emitting region on the light transmission component coincides with the second adjustable light transmission region.

In certain exemplary embodiments, the first adjustable light transmission region and the second adjustable light transmission region are arranged alternately.

In certain exemplary embodiments, the first adjustable light transmission region is transparent, the first light emitting region emits light, the second adjustable light transmission region is non-transparent, and the second light emitting region does not emit light.

In certain exemplary embodiments, an area of the first adjustable light transmission region and an area of the second adjustable light transmission region are equal.

In certain exemplary embodiments, a light emitting area of the first light emitting region is not larger than an area of the first adjustable light transmission region.

In certain exemplary embodiments, the light transmission component is a twisted nematic (TN) liquid crystal cell.

In order to solve the above problem, this disclosure further discloses a display device. The display device comprises a display and the light source assembly as stated above. The light source assembly and the display are stacked, and the light source is arranged between the display and the light transmission component. The display comprises a first pixel column and a second pixel column arranged alternately. An orthographic projection of the first light emitting region on the display is located between a first pixel column and a second pixel column that are adjacent to each other directly.

In certain exemplary embodiments, the display is a reflective liquid crystal display (LCD).

In order to solve the above problem, this disclosure further discloses a display method, which is applied in the display device as stated above. The method comprises:

when the display device performs 3D display, controlling the first adjustable light transmission region of the light transmission component to be transparent, the second adjustable light transmission region to be non-transparent, and controlling the first light emitting region of the light source to emit light, the second light emitting region not to emit light;

when the display device performs 2D display, controlling both the first adjustable light transmission region and the second adjustable light transmission region of the light transmission component to be transparent, and controlling both the first light emitting region and the second light emitting region of the light source to emit light.

Compared to the prior art, this disclosure has the following advantages:

In embodiments of this disclosure, the light source comprises a first light emitting region and a second light emitting region. The first light emitting region and the second light emitting region can control ON or OFF of the light emission separately. The first light emitting region and the second light emitting region are arranged alternately along a first direction. Since the first light emitting region and the second light emitting region of the light source can be controlled separately, one light emitting region can be made to emit light while the other light emitting region can be made to be turned off. There are no stray light in the turned-off light emitting region, so as to avoid stray light crosstalk to light of the other light emitting region.

In order to illustrate the technical solutions in the embodiments of the present disclosure or the prior art more clearly, the drawings required in describing the embodiments or the prior art will be introduced briefly below. Apparently, the drawings described below are only some embodiments of

BRIEF DESCRIPTION OF THE DRAWINGS

FIG. 1b shows a vertical view of the light source as shown in FIG. 1a;

DETAILED DESCRIPTION OF EMBODIMENTS

The technical solutions in the embodiments of the present disclosure will be described clearly and completely below in conjunction with the drawings in the embodiments of the present disclosure. Apparently, the embodiments described are only a part of rather than all of the embodiments of the present disclosure. Based on the embodiments in the present disclosure, all other embodiments obtained by the ordinary skilled person in the art without creative efforts belong to the protection scope of the present disclosure.

Embodiment I

Figure 1A:
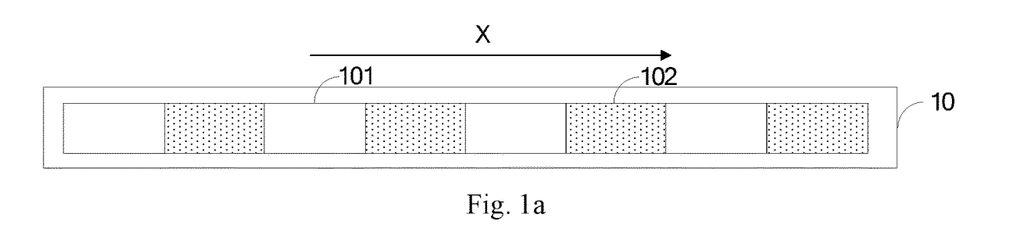
FIG. 1a shows a structural schematic view of a light source of Embodiment I of this disclosure.
Figure 1B:
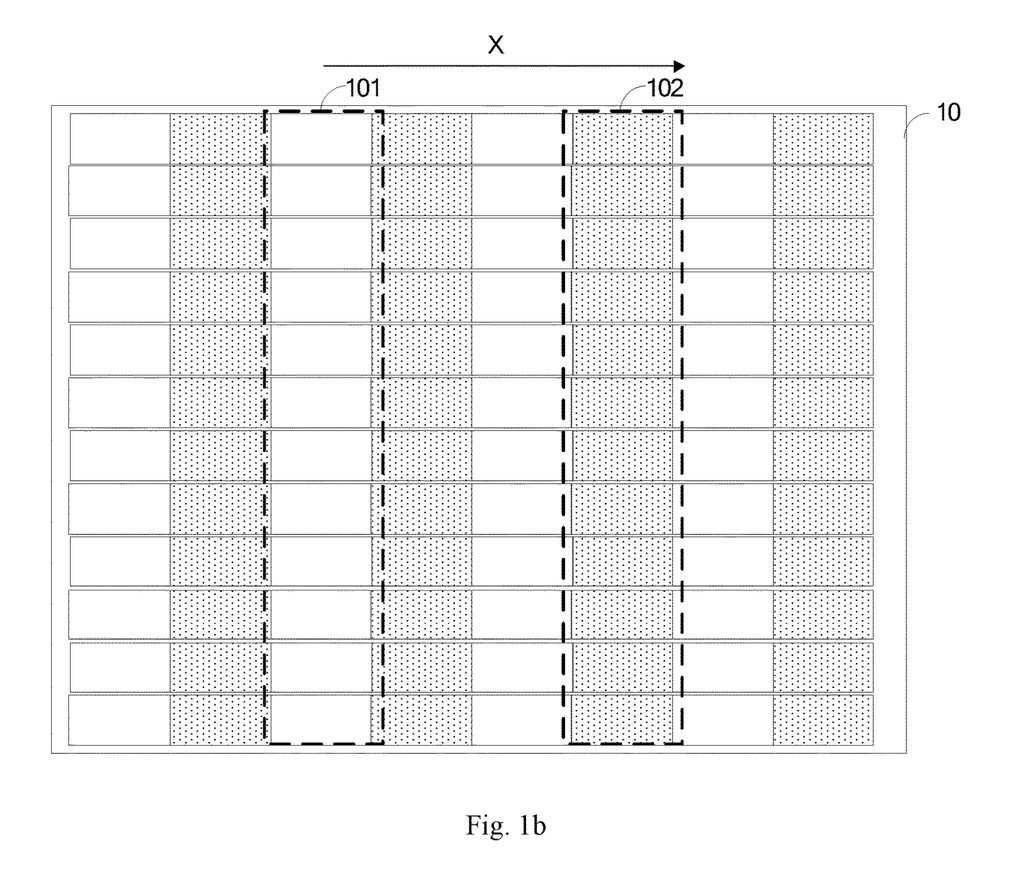

Referring to FIG. 1a and FIG. 1b, a light source provided by the embodiment of this disclosure is showed. The light source 10 comprises a first light emitting region 101 and a second light emitting region 102. The first light emitting region 101 and the second light emitting region 102 can control ON or OFF of the light emission separately. The first light emitting region 101 and the second light emitting region 102 are arranged alternately along a first direction.

In this embodiment, the first light emitting region 101 and the second light emitting region 102 of the light source 10 can control ON or OFF of the light emission separately. Specifically, there are four cases: the first light emitting region 101 and the second light emitting region 102 both emit light; Neither of the first light emitting region 101 and the second light emitting region 102 do not emit light; the first light emitting region 101 emits light while the second light emitting region 102 does not emit light; and the first light emitting region 101 does not emit light while the second light emitting region 102 emits light.

The first light emitting region 101 and the second light emitting region 102 are arranged alternately. Since the first light emitting region 101 and the second light emitting region 102 can control ON or OFF of the light emission separately, a light source in which the light emitting region and the non-light emitting region are arranged alternately can be formed. The turned-off light emitting region does not emit light, so as to avoid stray light crosstalk to the light emitting region. Further, the light source 10 can be used in cooperation with other components, e.g., being used as the backlight source or the front light source of the display.

The first light emitting region 101 and the second light emitting region 102 can also emit light alternately and periodically in time sequence. For example, in the first period, the first light emitting region 101 emits light while the second light emitting region 102 does not emit light; in the second period, the first light emitting region 101 does not emit light while the second light emitting region 102 emits light. In these two periods, the first light emitting region 101 and the second light emitting region 102 can both be turned off periodically, so as to prolong the service life of the light source. Moreover, emitting light alternately can also save power consumption.

In another exemplary embodiment of this disclosure, the light emitting areas of the first light emitting region 101 and the second light emitting region 102 are equal.

In this embodiment, the light emitting areas of the first light emitting region 101 and the second light emitting region 102 can be equal. When the first light emitting region 101 and the second light emitting region 102 emit light alternately, the light-emitting amount is same, which can ensure the light emitting effect.

In one exemplary embodiment of this disclosure, as shown in FIG. 1b, the shape of the first light emitting region 101 and the shape of the second light emitting region 102 are both strip shapes, and the length direction of the first light emitting region 101 and the length direction of the second light emitting region 102 are perpendicular to the first direction X.

In one exemplary embodiment of this disclosure, the first light emitting region 101 and the second light emitting region 102 are both constituted by a plurality of white organic light emitting diodes.

In this embodiment, the first light emitting region 101 and the second light emitting region 102 are both constituted by a plurality of white organic light-emitting diodes (WOLED). The WOLED is a light source with a low cost, a high efficiency and a long life. The light emitting mechanism of the WOLED is that the device emits red light, green light and blue light simultaneously so as to be mixed into white light. The red, green, and blue filter films are coated on the WOLED and visual three primary color light emission can be formed. Compared to a monochromic OLED such as green OLED and blue OLED, the WOLED has more usages.

Because the WOLED is a transparent light source, it can be used in cooperation with other components, for example, being used as the front light source of the display. The number of the WOLEDs in the light source 10 is determined based on the components used in cooperation with the WOLEDs, for example, the number of the WOLEDs is determined based on the size and number of pixels of the display. This is not specifically limited in the embodiment of this disclosure and it can be set based on actual conditions.

To sum up, in an embodiment of this disclosure, the light source comprises a first light emitting region and a second light emitting region. The first light emitting region and the second light emitting region can control ON or OFF of the light emission separately. The first light emitting region and the second light emitting region are arranged alternately along a first direction. Since the first light emitting region and the second light emitting region of the light source can be controlled separately, one light emitting region can be made to emit light while the other light emitting region can be made to be turned off. There are no stray light in the turned-off light emitting region, so as to avoid stray light crosstalk to light of the other light emitting region.

Further, the first light emitting region and the second emitting region are arranged alternately, so as to emit light alternately, prolong the service life of the light source, and save the power consumption.

Embodiment II

Figure 2:
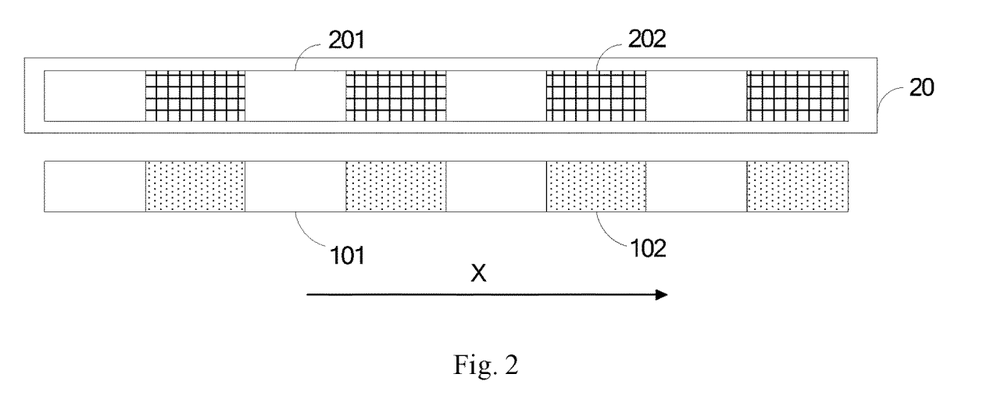
FIG. 2 shows a structural schematic view of a light source assembly of Embodiment II of this disclosure.

Referring to FIG. 2, a light source assembly provided by an embodiment of this disclosure is showed. The light source assembly comprises a stacked light transmission component 20 and the light source 10 as stated in Embodiment I. The light transmission component 20 comprises a first adjustable light transmission region 201 and a second adjustable light transmission region 202. The first adjustable light transmission region 201 and the second adjustable light transmission region 202 can control transmission or occlusion of light separately. The orthographic projection of the first light emitting region 101 on the light transmission component 20 coincides with the first adjustable light transmission region 201, and the orthographic projection of the second light emitting region 102 on the light transmission component 20 coincides with the second adjustable light transmission region 202.

In this embodiment, the first adjustable light transmission region 201 and the second adjustable light transmission region 202 in the light transmission component 20 can control transmission or occlusion of light separately. Specifically, there are four cases: the first adjustable light transmission region 201 and the second adjustable light transmission region 202 both transmit light; the first adjustable light transmission region 201 and the second adjustable light transmission region 202 both occlude light; the first adjustable light transmission region 201 transmits light while the second adjustable light transmission region 202 occludes light; and the first adjustable light transmission region 201 occludes light while the second adjustable light transmission region 202 transmits light The light source assembly in the embodiment of this disclosure can be used in cooperation with other components. For example, the light source assembly and the reflective LCD are stacked to form a stereo image display device. The incident light emitted by the light source forms reflected light on the reflective LCD, and the reflected light passes through the adjustable light transmission regions of the light transmission component to synthesize a stereo image in the human eyes. When the adjustable light transmission region of the light transmission component 20 occludes light, the light emitting region corresponding to this adjustable light transmission region does not emit light, so as to avoid stray light crosstalk to the reflected light that passes through the adjustable light transmission region, thereby improving the synthesizing effect of the stereo image.

In one exemplary embodiment of this disclosure, the first adjustable light transmission region 201 and the second adjustable light transmission region 202 are arranged alternately.

In this embodiment, the first light emitting region 101 is opposite to the first adjustable light transmission region 201, the second light emitting region 102 is opposite to the second adjustable light transmission region 202, the first light emitting region 101 and the second light emitting region 102 in the light source 10 can be arranged alternately, and the first adjustable light transmission region 201 and the second adjustable light transmission region 202 of the light transmission component 20 can also be arranged alternately.

In one exemplary embodiment of this disclosure, the first adjustable light transmission region 201 is transparent, the first light emitting region 101 emits light, the second adjustable light transmission region 202 is non-transparent, and the second light emitting region 102 does not emit light.

In this embodiment, the first light emitting region 101 is used in cooperation with the first adjustable light transmission region 201, and the second light emitting region 102 is used in cooperation with the second adjustable light transmission region 202. Specifically, when the first adjustable light transmission region 201 is transparent, the first light emitting region 101 is turned on, and when the second adjustable light transmission region 202 is non-transparent, the second light emitting region 102 does not emit light; when the first adjustable light transmission region 201 is non-transparent, the first light emitting region 101 is turned off, and when the second adjustable light transmission region 202 is transparent, the second light emitting region 102 emits light.

In one exemplary embodiment of this disclosure, the area of the first adjustable light transmission region 201 and the area of the second adjustable light transmission region 202 are equal.

In this embodiment, when the first light emitting region 101 is used in cooperation with the first adjustable light transmission region 201 and the second light emitting region 102 is used in cooperation with the second adjustable light transmission region 202, the area of the first adjustable light transmission region 201 and the area of the second adjustable light transmission region 202 can be equal, so as to enable the light source assembly to be uniformly transmissive to light.

In one optical embodiment of this disclosure, the light emitting area of the first light emitting region 101 is not larger than the area of the first adjustable light transmission region 201.

In this embodiment, when the first adjustable light transmission region 201 is transparent, the first light emitting region 101 is turned on. The light emitting area of the first light emitting region 101 is not larger than the area of the first adjustable light transmission region 201, so as to avoid the light emitted by the first light emitting region 101 to be illuminated to the second adjustable light transmission region to form stray light crosstalk.

In one exemplary embodiment of this disclosure, the light transmission component 20 is a twisted-nematic (TN) liquid crystal cell.

In this embodiment, the light transmission component 20 can use a TN liquid crystal cell. The light polarization direction of the energized area of the TN liquid crystal cell does not deflect and the light polarization direction of the non-energized area of the TN liquid crystal cell deflects. The TN liquid crystal cell is used in cooperation with a polarizer, so as to control the polarization direction of light, thereby achieving the effect of transmitting or occluding light.

To sum up, in the embodiment of this disclosure, the light source assembly comprises a stacked light transmission component and a light source. The light transmission component comprises a first adjustable light transmission region and a second adjustable light transmission region. The first adjustable light transmission region and the second adjustable light transmission region can control transmission or occlusion of the light separately. The orthographic projection of the first light emitting region on the light transmission component coincides with the first adjustable light transmission region, and the orthographic projection of the second light emitting region on the light transmission component coincides with the second adjustable light transmission region. The light transmission component is used in cooperation with the light source. When one adjustable light transmission region of the light transmission component occludes light, the light emitting region corresponding to the adjustable light transmission region is turned off. The turned-off light emitting region has no stray light, so as to avoid stray light crosstalk to the light of the light emitting region that emits light.

Embodiment III

Figure 3:
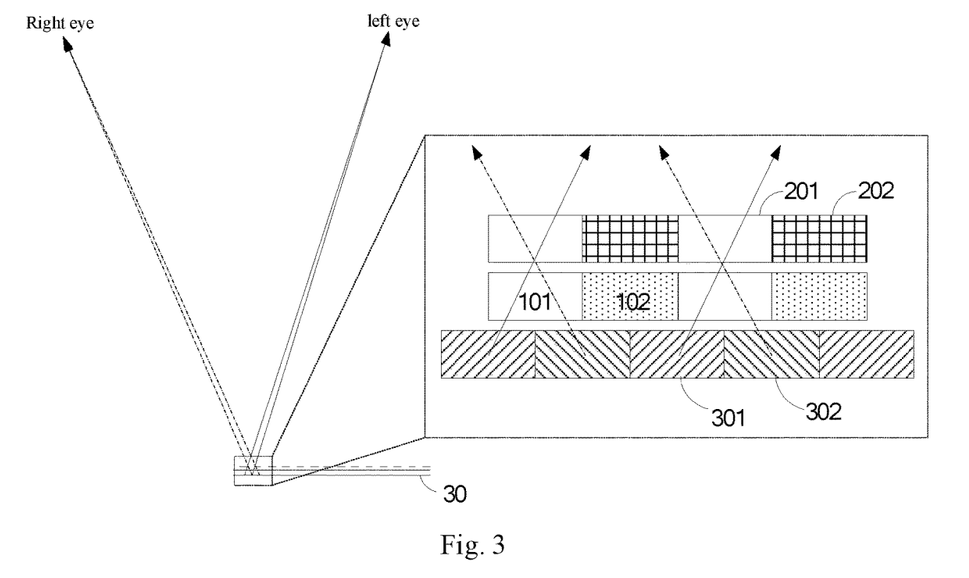
FIG. 3 shows a structural schematic view of a display device of Embodiment III of this disclosure.

Referring to FIG. 3, it shows a display device provided by an embodiment of this disclosure.

The display device comprises a display 30 and the light source assembly as stated in Embodiment II. The light source assembly and the display 30 are stacked, and the light source in the light source assembly is arranged between the display 30 and the light transmission component in the light source assembly. The display 30 comprises a first pixel column 301 and a second pixel column 302 arranged alternately. The orthographic projection of the first light emitting region 101 on the display 30 is located between a first pixel column 301 and a second pixel column 302 that are adjacent with each other directly.

In this embodiment, the light source assembly and the display 30 are stacked, and the light source assembly is arranged on the side of the display surface of the display 30. The display comprises a first pixel column 301 and a second pixel column 302. When the first pixel column 301 and the second pixel column 302 display the left eye image and the right eye image respectively, the light transmission component 20 in the light source assembly forms an optical grating. The light source 10 emits incident light, the incident light forms reflected light on the display surface of the display 30, and the reflected light passes through the adjustable light transmission regions of the light transmission component 20 to synthesize a stereo image in human eyes.

When the light transmission component 20 forms the optical grating, the light emitting region and the non-light emitting region of the light source 10 are arranged alternatively. Partial regions of the light source do not emit light, so as to avoid stray light crosstalk to the reflected light that passes through the adjustable light transmission region of the light transmission component 20, thereby avoiding the influences of the stray light on the synthesis effect of the stereo image.

In an exemplary embodiment of this disclosure, the display is a reflective liquid crystal display.

To sum up, in the embodiment of this disclosure, the display device comprises a display and a light source assembly. The light source assembly and the display are stacked, and the light source in the light source assembly is arranged between the display and the light transmission component in the light source assembly. The embodiment of this disclosure not only provides a switchable 3D display device, but also avoids the influences of the stray light on the synthesis effect of the stereo image.

Embodiment IV

Figure 4:
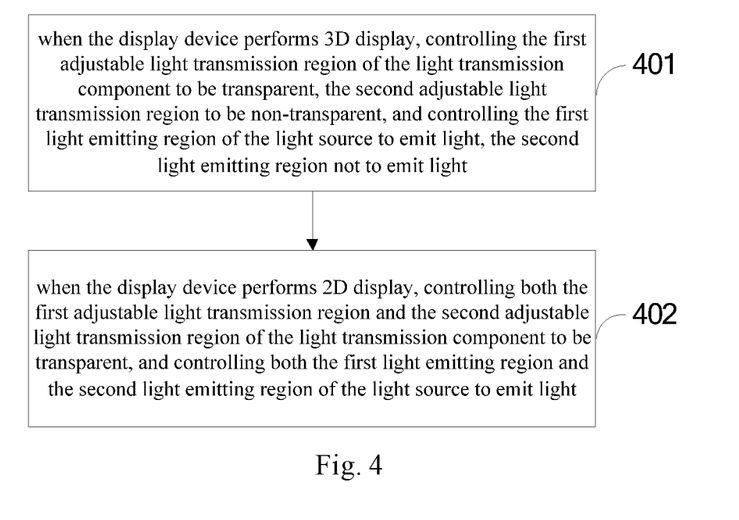
FIG. 4 shows a flow chart of a display method of Embodiment IV of this disclosure.

Referring to FIG. 4, it shows a step flow chart of a display method of an embodiment of this disclosure. The method is applied in the display device as stated in Embodiment III, and comprises step 401 and step 402.

Step 401: when the display device performs 3D display, controlling the first adjustable light transmission region of the light transmission component to be transparent, the second adjustable light transmission region to be non-transparent, and controlling the first light emitting region of the light source to emit light, the second light emitting region not to emit light.

In this embodiment, the display device can realize two kinds of image display, one of which is 3D display, i.e., stereo image display, and the other of which is 2D display, i.e., planar image display.

When the display device performs 3D display, the first pixel column 301 and the second pixel column 302 in the display the left eye image and the right eye image respectively. At this time, the first adjustable light transmission region 201 of the light transmission component is controlled to be transparent, and the second adjustable light transmission region 202 is controlled to be non-transparent, so as to form an optical grating. The first light emitting region 101 of the light source is controlled to emit light, the second light emitting region 102 is controlled not to emit light, so as to form a light source in which the light emitting region and the non-light emitting region are arranged alternately.

The first light emitting region 101 of the light source emits incident light. The incident light forms reflected light of the left eye image in the first pixel column 301 of the display. The reflected light passes through the first adjustable light transmission region 201 of the light transmission component to enter the left eye of the user. The incident light forms reflected light of the right eye image in the second pixel column 302 of the display. The reflected light passes through the first adjustable light transmission region 201 of the light transmission component to enter the right eye of the user. The reflected light of the left eye image and the reflected light of the right eye image enter the human eyes to synthesize a stereo image. The second light emitting region 102 of the light source does not emit light, so as to avoid stray light crosstalk to the reflected light of the left eye image and the reflected light of the right eye image, thereby influencing the synthesis effect of the stereo image.

Step 402: when the display device performs 2D display, controlling both the first adjustable light transmission region and the second adjustable light transmission region of the light transmission component to be transparent, and controlling both the first light emitting region and the second light emitting region of the light source to emit light.

In this embodiment, when the display device performs 2D display, the first pixel column 301 and the second pixel column 302 in the display display planar images. At this time, the first adjustable light transmission region 201 and the second adjustable light transmission region 202 of the light transmission component are controlled to be both transparent, so as to form a full light transmission component. The first light emitting region 101 and the second light emitting region 102 of the light source are both controlled to emit light, so as to form a full light emitting light source.

The first light emitting region 101 and the second light emitting region 102 of the light source both emit incident light. The incident light forms reflected light on the display. The reflected light passes through the full light transmission component to enter the eyes of the user. The image viewed by the user is namely the planar image displayed by the display.

To sum up, in embodiments of this disclosure, when the display device performs 3D display, the first adjustable light transmission region of the light transmission component is controlled to be transparent, the second adjustable light transmission region is controlled to be non-transparent, and the first light emitting region of the light source is controlled to emit light, and the second light emitting region is controlled not to emit light. When the display device performs 2D display, the first adjustable light transmission region and the second adjustable light transmission region of the light transmission component are both controlled to be transparent, and the first light emitting region and the second light emitting region of the light source are both controlled to emit light. The 2D display and the 3D display can be realized by controlling the light transmission component in the display device, and the stray light crosstalk in 3D display can be avoided by controlling the light source in the display device, so as to improve the synthesis effect of the stereo image.

For the preceding method embodiments, for the sake of simplicity, they are all described as a series of action combinations. However, the skilled person in the art should know that this disclosure is not limited by the order of the actions described, because some steps can be performed in other orders or simultaneously according to this disclosure. Secondly, the skilled person in the art should also know that the embodiments described in the description all belong to exemplary embodiments, and the actions and the modules involved are not necessarily required by this disclosure.

The embodiments in this description are all described in a progressive way. Each embodiment stresses differences from other embodiments. The same or similar parts among the embodiments can make reference to each other.

Finally, it should be further noted that in this text, the relation terms such as first and second are only used for distinguishing one entity or operation from another entity or operation, while not necessarily requiring or implying presence of any such actual relation or order between these entities or operations. Moreover, the terms "comprise", "include" or any other variants thereof intend to cover nonexclusive inclusion, thereby enabling a process, a method, a commodity or a device that includes a series of elements to not only include those elements but also include other elements not listed explicitly, or further include inherent elements of such process, method, commodity or device. In the absence of more limitations, the element defined by "including a(an) . . . " does not exclude presence of other same elements in the process, method, commodity or device that includes the element.

The light source, the light source assembly, the display device and the display method provided by this disclosure have been introduced in detail as above. Specific examples are applied in this text to explain the principle and the implementation of this disclosure. The explanations of the above embodiments are only used for facilitating understanding of the method of this disclosure and the core concept thereof. Meanwhile, for the ordinary skilled person in the art, according to the concept of this disclosure, there would be modifications in both specific implementations and the application scopes. To sum up, the contents of this description should be not interpreted as limitations to this disclosure.

The invention claimed is:

1. A light source assembly, comprising a stacked light transmission component and a light source, the light source comprising:
   a first light emitting region and a second light emitting region, the first light emitting region and the second light emitting region being capable of controlling ON and OFF of a light emission seperately,
   the first light emitting region and the second light emitting region being arranged alternately along the first direction;
   wherein the stacked light transmission component comprises a first adjustable light transmission region and a second adjustable light transmission region, the first adjustable light transmission region and the second adjustable light transmission region being capable of controlling transmission or occlusion of light separately;
   and wherein an orthographic projection of the first light emitting region on the light transmission component coincides with the first adjustable light transmission region, and an orthographic projection of the second light emitting region on the light transmission component coincides with the second adjustable light transmission region.

2. The light source assembly according to claim 1, wherein the first adjustable light transmission region and the second adjustable light transmission region are arranged alternately.

3. The light source assembly according to claim 1, wherein the first adjustable light transmission region is transparent, the first light emitting region emits light, the second adjustable light transmission region is non-transparent, and the second light emitting region does not emit light.

4. The light source assembly according to claim 1, wherein an area of the first adjustable light transmission region and an area of the second adjustable light transmission region are equal.

5. The light source assembly according to claim 1, wherein a light emitting area of the first light emitting region is not larger than an area of the first adjustable light transmission region.

6. The light source assembly according to claim 1, wherein the light transmission component is a twisted nematic liquid crystal cell.

7. A display device, comprising: a display and the light source assembly as claimed in claim 1;
   wherein the light source assembly and the display are stacked, and the light source is arranged between the display and the light transmission component;
   wherein the display comprises a first pixel column and a second pixel column arranged alternately, the orthographic projection of the first light emitting region on the display is located between a first pixel column and a second pixel column that are adjacent to each other directly.

8. The display device according to claim 7, wherein the display is a reflective liquid crystal display.

9. A display method, which is applied in the display device as claimed in claim 7; wherein the method comprises:
   when the display device performs 3D display, controlling the first adjustable light transmission region of the light transmission component to be transparent, the second adjustable light transmission region to be non-transparent, and controlling the first light emitting region of the light source to emit light, the second light emitting region not to emit light;
   when the display device performs 2D display, controlling both the first adjustable light transmission region and the second adjustable light transmission region of the light transmission component to be transparent, and controlling both the first light emitting region and the second light emitting region of the light source to emit light.

10. The display device according to claim 7, wherein the first adjustable light transmission region and the second adjustable light transmission region are arranged alternately.

11. The display device according to claim 7, wherein the first adjustable light transmission region is transparent, the first light emitting region emits light, the second adjustable light transmission region is non-transparent, and the second light emitting region does not emit light.

12. The display device according to claim 7, wherein an area of the first adjustable light transmission region and an area of the second adjustable light transmission region are equal.

13. The display device according to claim 7, wherein a light emitting area of the first light emitting region is not larger than an area of the first adjustable light transmission region.

14. The light source assembly according to claim 1, wherein light emitting areas of the first light emitting region and the second light emitting region are equal.

15. The light source assembly according to claim 1, wherein a shape of the first light emitting region and a shape of the second light emitting region are both strip shapes, a length direction of the first light emitting region and a length direction of the second light emitting region are perpendicular to the first direction.

16. The light source assembly according to claim 1, wherein the first light emitting region and the second light emitting region are both constituted by a plurality of white organic light emitting diodes.

* * * * *